US008502540B2

(12) United States Patent
Nakanishi et al.

(10) Patent No.: US 8,502,540 B2
(45) Date of Patent: Aug. 6, 2013

(54) WIRELESS MAGNETIC RESONANCE IMAGING APPARATUS GENERATING SYNCHRONIZED CLOCK-REGENERATED SIGNALS AND VIDEO

(75) Inventors: Toshiyuki Nakanishi, Yokohama (JP); Koji Akita, Yokohama (JP); Hideo Kasami, Yokohama (JP); Takahiro Sekiguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 815 days.

(21) Appl. No.: 12/614,943

(22) Filed: Nov. 9, 2009

(65) Prior Publication Data

US 2010/0117649 A1 May 13, 2010

(30) Foreign Application Priority Data

Nov. 11, 2008 (JP) .................. 2008-288990

(51) Int. Cl.
*G01R 33/36* (2006.01)
*G01R 33/3607* (2006.01)

(52) U.S. Cl.
USPC .......................................... 324/322; 324/318

(58) Field of Classification Search
USPC ... 324/300–322; 600/407–435; 382/128–131; 333/219–235; 455/12.1; 250/370.09; 348/537; 342/132
See application file for complete search history.

(56) References Cited

U.S. PATENT DOCUMENTS

| 5,384,536 | A | | 1/1995 | Murakami et al. ............ 324/309 |
| 5,511,553 | A | * | 4/1996 | Segalowitz ................... 600/508 |
| 6,091,356 | A | * | 7/2000 | Sanders et al. ................ 342/132 |
| 6,323,910 | B1 | * | 11/2001 | Clark, III ....................... 348/537 |
| 7,123,009 | B1 | * | 10/2006 | Scott ............................. 324/311 |
| 7,180,074 | B1 | * | 2/2007 | Crosetto .................. 250/370.09 |
| 7,323,876 | B2 | * | 1/2008 | Den Boef ...................... 324/322 |

(Continued)

FOREIGN PATENT DOCUMENTS

| JP | 5-261083 | 10/1993 |
| JP | 5-261085 | 10/1993 |

(Continued)

OTHER PUBLICATIONS

Office Action issued Mar. 5, 2012 in Netherlands Patent Application No. 2003775 (with English-language translation).

(Continued)

*Primary Examiner* — Melissa Koval
*Assistant Examiner* — Tiffany Fetzner
(74) *Attorney, Agent, or Firm* — Oblon, Spivak, McClelland, Maier & Neustadt, L.L.P.

(57) ABSTRACT

A magnetic resonance imaging apparatus includes a probe unit and a control/imaging unit. The probe unit includes a converter converting a sampled magnetic-resonance signal into a digital signal, a first transmitter converting the digital signal into a first-radio signal, a first receiver receiving and performing detection on the second-radio signal to obtain a first-received signal, and a clock-regeneration unit regenerating a clock component from the first-received signal to generate a regenerated-clock signals. The control/imaging unit includes a second-receiver receiving the first-radio signal to obtain a second-received signal, a data processor performing data processing on the second-received signal in synchronism with a reference-clock signal to obtain a video signal, and a second transmitter which modulates a carrier wave using the reference-clock signal, converts the reference-clock signal into the second-radio signal, and transmits the second-radio signal through the second-wireless channel.

13 Claims, 8 Drawing Sheets

U.S. PATENT DOCUMENTS

| | | | |
|---|---|---|---|
| 7,391,214 B2 * | 6/2008 | Adachi | 324/322 |
| 7,443,165 B2 * | 10/2008 | Varjo | 324/322 |
| 8,174,264 B2 * | 5/2012 | Adachi et al. | 324/318 |
| 2006/0244452 A1 * | 11/2006 | Den Boef | 324/322 |
| 2007/0176601 A1 * | 8/2007 | Adachi | 324/318 |
| 2007/0182409 A1 * | 8/2007 | Varjo | 324/304 |
| 2009/0267601 A1 | 10/2009 | Van Helvoort et al. | 324/309 |
| 2009/0322335 A1 * | 12/2009 | Adachi et al. | 324/318 |
| 2010/0117649 A1 * | 5/2010 | Nakanishi et al. | 324/318 |

FOREIGN PATENT DOCUMENTS

| | | |
|---|---|---|
| JP | 6-70903 | 3/1994 |
| JP | 6-209913 | 8/1994 |
| JP | 6-232930 | 8/1994 |
| JP | 2004-527843 | 9/2004 |
| JP | 2005-305153 | 11/2005 |
| JP | 2008-518652 | 6/2008 |
| WO | WO 2006/048816 A1 | 5/2006 |

OTHER PUBLICATIONS

Office Action issued on Aug. 4, 2011 in the corresponding German Application No. 10 2009 046 604.5 (with English Translation).

Office Action mailed May 7, 2013 in Japanese Application No. 2008-288990 filed Nov. 11, 2008 (w/English translation).

* cited by examiner

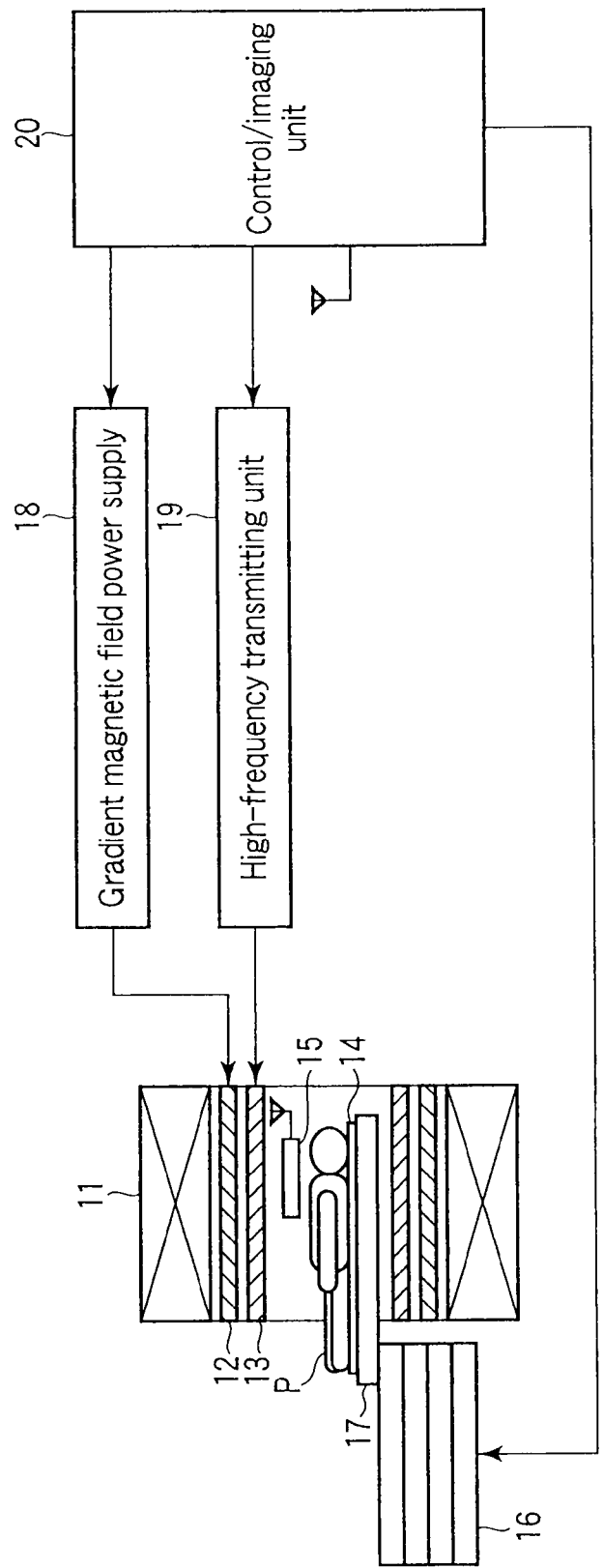
F I G. 1

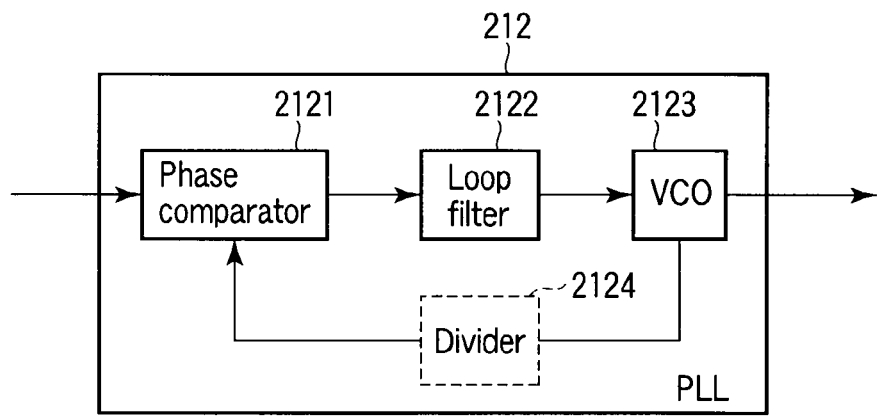
F I G. 8
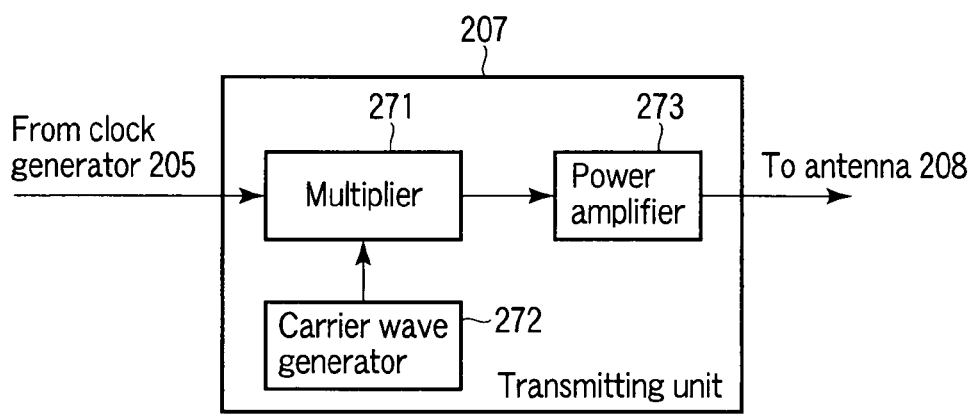
F I G. 9
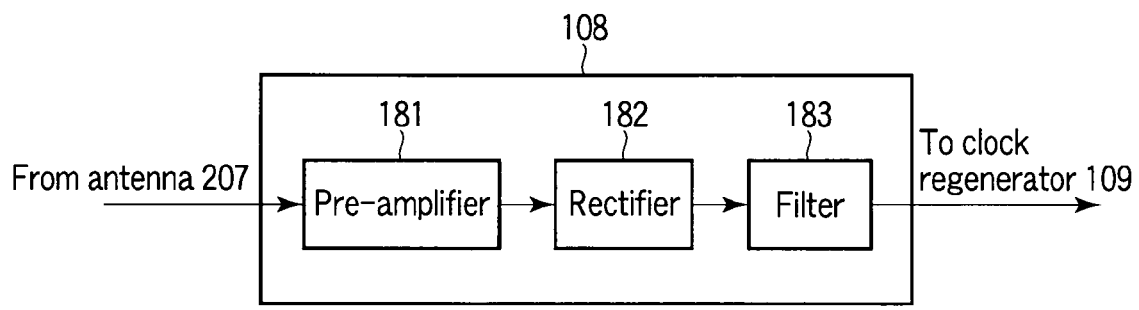
F I G. 10

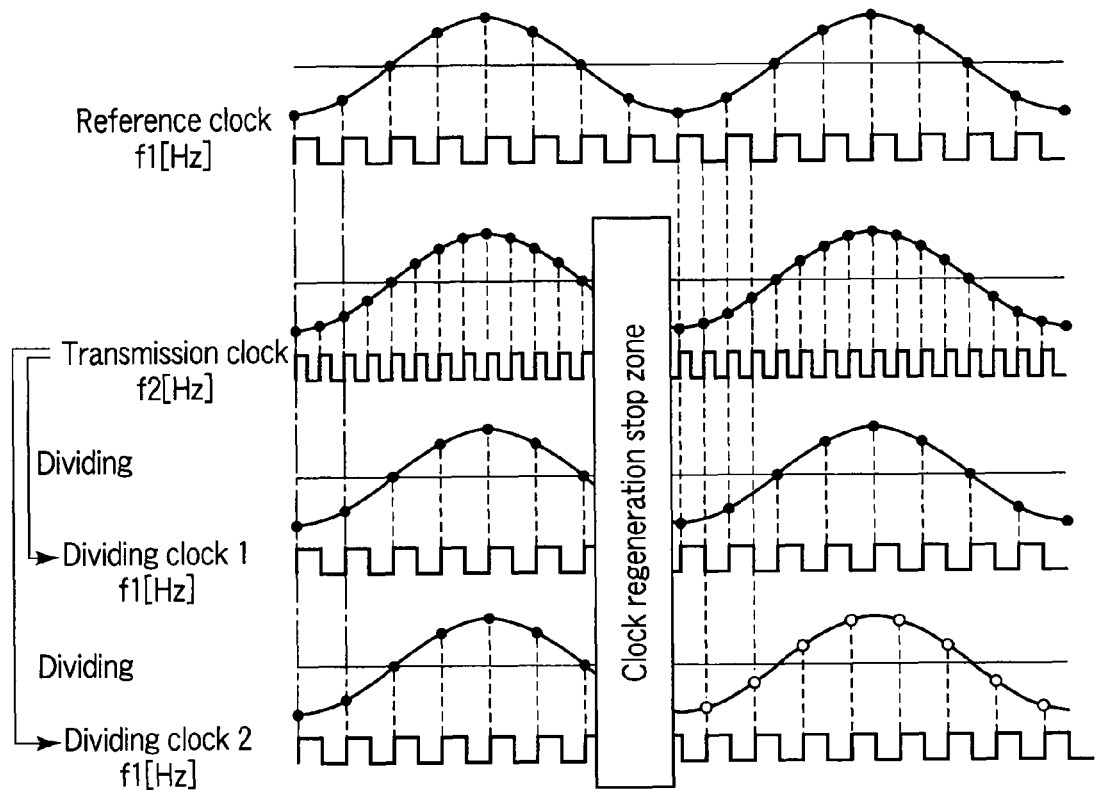
F I G. 11

WIRELESS MAGNETIC RESONANCE IMAGING APPARATUS GENERATING SYNCHRONIZED CLOCK-REGENERATED SIGNALS AND VIDEO

CROSS-REFERENCE TO RELATED APPLICATIONS

This application is based upon and claims the benefit of priority from prior Japanese Patent Application No. 2008-288990, filed Nov. 11, 2008, the entire contents of which are incorporated herein by reference.

BACKGROUND OF THE INVENTION

1. Field of the Invention

The present invention relates to a magnetic resonance imaging apparatus for transmitting a magnetic resonance signal and a clock signal by radio.

2. Description of the Related Art

In magnetic resonance imaging (MRI) apparatuses, a detection coil for detecting a magnetic resonance signal is placed in the imaging space of a gantry, along with a subject. The magnetic resonance signal detected by the detection coil is transmitted to a main unit (hereinafter referred to as "a control/imaging unit") via a cable led from the interior of the imaging space to the outside of the gantry. The control/imaging unit executes imaging by performing, on the detected magnetic resonance signal, data processing that includes image reconstruction processing.

In the above-mentioned general structure, the cable is often obstructive to operators and/or operations. To avoid this, a probe unit including a detection coil called an RF probe has been proposed in which a magnetic resonance signal is digitized by an analog-to-digital converter (ADC), then converted into a radio signal, and transmitted to a control/imaging unit.

The ADC in the probe unit requires a sampling clock signal. When the sampling clock signal must be highly accurately synchronized with a reference clock signal used by the control/imaging unit, a highly accurate oscillator, such as an oven controlled crystal oscillator (OCXO) or a temperature controlled crystal oscillator (TCXO), must be used as a clock signal source. Since such a highly accurate oscillator has a large size, if it is provided in the probe unit, the probe unit is inevitably increased in size and weight, which is a significant load on a subject.

JP-A 5-261083 (KOKAI) describes that a sampling clock signal may be transmitted by radio from a control unit to a probe unit. In this case, the problem that occurs when a clock signal source is provided in the probe unit is avoided. However, this publication does not disclose a method of transmitting the sampling clock signal by radio or a method of regenerating the clock signal from a received signal.

On the other hand, JP-A 6-232930 (KOKAI) discloses a clock signal regeneration circuit for use in a demodulator for demodulating an angular modulation wave. This clock signal regeneration circuit regenerates a clock signal when an angular modulation signal, such as a QPSK input to the demodulator, is demodulated. More specifically, the angular modulation wave input to a frequency converter formed of an oscillator, a mixer and a low-pass filter is subjected to frequency conversion, then digitized by an ADC, and then input to a digital signal processor, where demodulation and clock signal regeneration are performed.

JP-A 5-261083 (KOKAI) does not disclose a method of transmitting the sampling clock signal by radio, or a method of regenerating the clock signal from a received signal. If the clock signal regeneration circuit disclosed by JP-A 6-232930 (KOKAI) is used, the frequency converter, the ADC and the digital signal processor must be employed. Further, the accuracy of the regeneration clock signal is influenced by that of the oscillator, and that of the clock signal used in the ADC.

In addition, in general, a regeneration stop zone, in which the regeneration of the clock signal is temporarily stopped, exists in a magnetic resonance signal acquisition period, and there is a case where it is necessary to keep in phase the clock signals generated before and after the regeneration stop zone, or to keep in phase the clock signals even when the distance between the transmitting and receiving antennas varies during the magnetic resonance signal acquisition period. However, neither JP-A 5-261083 (KOKAI) nor JP-A 6-232930 (KOKAI) discloses any countermeasures against these problems.

BRIEF SUMMARY OF THE INVENTION

In accordance with an aspect of the invention, there is provided a magnetic resonance imaging apparatus comprising a probe unit and a control/imaging unit, the probe unit including: a probe which detects a magnetic resonance signal in a subject; an analog-to-digital converter which samples the magnetic resonance signal using a sampling clock signal, and converts the sampled magnetic resonance signal into a digital signal; a first transmitter which converts the digital signal into a first radio signal and transmits the first radio signal through a first wireless channel; a first receiver which receives a second radio signal transmitted through a second wireless channel, and performs envelope detection on the second radio signal to obtain a first received signal; and a clock regeneration unit configured to regenerate a clock component from the first received signal to generate a regenerated clock signal to be used as a base signal for the sampling clock signal, the control/imaging unit including: a second receiver which receives the first radio signal to obtain a second received signal; a clock generator which generates a reference clock signal; a data processor which performs data processing on the second received signal in synchronism with the reference clock signal to obtain a video signal, the data processing including image reconstruction processing; and a second transmitter including an AM modulator which modulates an amplitude of a carrier wave using the reference clock signal, the second transmitter converting the reference clock signal into the second radio signal and transmitting the second radio signal through the second wireless channel.

In accordance with another aspect of the invention, there is provided a magnetic resonance imaging apparatus comprising a probe unit and a control/imaging unit, the probe unit including: a probe which detects a magnetic resonance signal in a subject; an analog-to-digital converter which samples the magnetic resonance signal using a sampling clock signal, and converts the sampled magnetic resonance signal into a first digital signal; a pre-transmission processor which performs pre-transmission processing on the first digital signal in synchronism with a first processing clock signal to obtain a second digital signal; a first transmitter which converts the second digital signal into a first radio signal and transmits the first radio signal through a first wireless channel; a first receiver which receives a second radio signal transmitted through a second wireless channel, and performs envelope detection on the second radio signal to obtain a first received signal; a clock regeneration unit configured to regenerate a clock component from the first received signal to generate a regenerated clock signal; and a first multiplier which multiplies the regenerated clock signal by preset values to generate the sampling clock signal and the first processing clock signal, the control/imaging unit including: a second receiver which receives the first radio signal to obtain a second received signal; a clock generator which generates a reference clock; a second multiplier which multiplies the reference clock signal by a first preset value to generate a second processing clock signal; a data processor which performs data processing on the second received signal using the second processing clock signal to obtain a magnetic resonance imaging signal, the data processing including image reconstruction processing; and a second transmitter including an AM modulator which modulates an amplitude of a carrier wave using the reference clock signal, the second transmitter converting the reference clock signal into the second radio signal and transmitting the second radio signal through the second wireless channel.

BRIEF DESCRIPTION OF THE SEVERAL VIEWS OF THE DRAWING

FIG. 1 is a block diagram illustrating an MRI apparatus according to a first embodiment;

FIG. 8 is a block diagram illustrating a typical PLL;

FIG. 9 is a block diagram illustrating a block diagram illustrating a transmitting unit incorporated in the control/imaging unit;

FIG. 10 is a block diagram illustrating a block diagram illustrating a receiving unit incorporated in the probe units;

FIG. 11 is a timing chart useful in explaining a phase shift problem that occurs when a clock signal regeneration stop period exists;

DETAILED DESCRIPTION OF THE INVENTION

Figure 2:
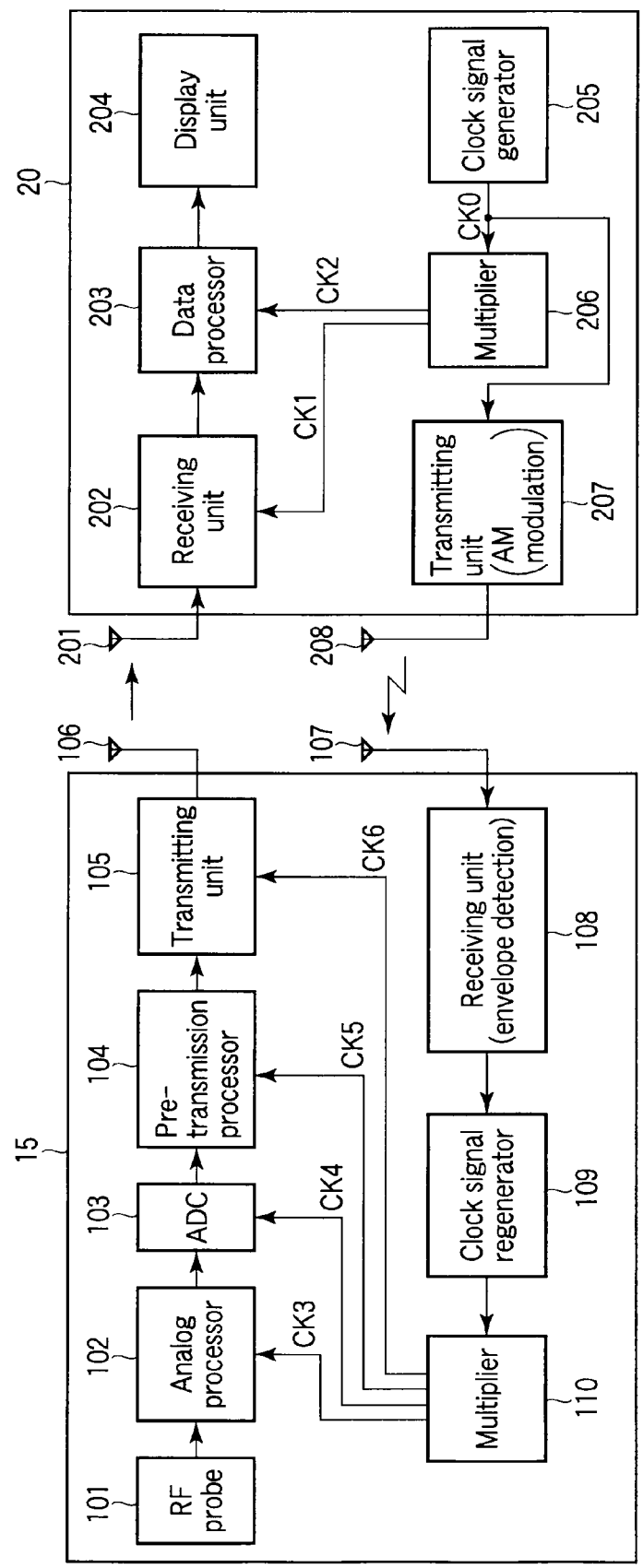
FIG. 2 is a block diagram illustrating examples of the probe units and control/imaging unit shown in FIG. 1.

Embodiments of the invention will be described with reference to the accompanying drawings.

The embodiments of the present invention provide a magnetic resonance imaging apparatus having a probe unit of a simple structure and capable of assuring accurate synchronization of the clock signals between the probe unit and the control/imaging unit.

First Embodiment

FIG. 1 shows an MRI apparatus according to a first embodiment. A magnetostatic field magnet 11, a gradient coil 12, an RF coil unit 13, a probe unit 14, a probe unit 15, and a top panel 17 included in a bed 16 are contained in a so-called gantry. The bed 16 is movable, and its position is controlled by a bed position controller described later. A gradient magnetic field power supply 18 is connected to the gradient coil 12, and a high-frequency transmitting unit 19 is connected to the RF coil unit 13. The probe unit 14 is connected to a control/imaging unit 20 via a wired channel (not shown). The other probe unit 15 is connected to the control/imaging unit 20 via a wireless channel.

The magnetostatic field magnet 11 is a hollow cylindrical member and is configured to generate a uniform magnetostatic field. A permanent magnet, superconductive magnet or the like is used as the magnetostatic field magnet 11. The gradient coil 12 is a hollow cylindrical member and is formed of the combination of three types of coils corresponding to X, Y and Z axes perpendicular to each other. When the three types of coils of the gradient coil 12 receive respective currents from the gradient magnetic field power supply 18, different gradient magnetic fields are generated along the X-, Y- and Z-axes. Assume here, for example, that the Z-axis direction is identical to the direction of the magnetostatic field.

The X-, Y- and Z-axis gradient magnetic fields correspond to, for example, a slice selection gradient magnetic field Gss, a phase encode gradient magnetic field Gpe, and a readout gradient magnetic field Gro, respectively. The slice selection gradient magnetic field Gss is used to determine an arbitrary imaging cross-section. The phase encode gradient magnetic field Gpe is used to change the phase of a magnetic resonance signal in accordance with a spatial position. The readout gradient magnetic field Gro is used to change the frequency of the magnetic resonance signal in accordance with the spatial position.

A subject (e.g., patient) P is placed on the top panel 17 of the bed 16, and inserted into the internal space (imaging space) of the gradient coil 12. The bed 16 is controlled by a bed controller, described later, so that the top panel 17 is moved along the axis of the gradient coil 12 and vertically. In general, the bed 16 is installed so that the longitudinal axis of the top panel 17 is set parallel to the axis of the magnetostatic field magnet.

The RF coil unit 13 comprises a cylindrical case, and a single coil or a plurality of coils contained therein, and is located inside the gradient coil 12. When the high-frequency transmitting unit 19 supplies the RF coil unit 13 with an RF pulse signal (high-frequency pulse signal) corresponding to the Larmor frequency, the RF coil unit 13 generates a high-frequency magnetic field. The probe unit 14 includes at least one RF probe as an RF coil for detecting a magnetic resonance signal, and is placed on or contained in the top panel 17. Similarly, the probe unit 15 includes an RF probe as another RF coil for detecting a magnetic resonance signal. The probe unit 15 is placed on a patient P.

When imaging is performed, the probe units 14 and 15 are inserted into the imaging space, along with the patient P, to detect a magnetic resonance signal resulting from a magnetic resonance phenomenon that occurs in the patient P. Various types of probe units can be used as the probe units 14 and 15. The probe unit 15 is separate from the main unit of the MRI apparatus, and has a function of transmitting the detected magnetic resonance signal to the control/imaging unit 20 by a wireless channel.

The control/imaging unit 20 controls the gradient magnetic field power supply 18 and the high-frequency transmitting unit 19. Specifically, the control/imaging unit 20 transmits and receives signals to and from the probe unit 14 via a wired channel, and transmits and receives signals to and from the probe unit 15 via a wireless channel, thereby performing data processing, including image regeneration, on the magnetic resonance signals transmitted from the probe units 14 and 15 to generate an imaging signal indicating the video image of an internal part of the patient P.

Referring now to FIGS. 2 to 10, the wireless probe unit 15 and control/imaging unit 20 will be described in detail. Note that FIG. 2 does not show the structure of the control/imaging unit 20 related to the control of the gradient magnetic field power supply 18 and the high-frequency transmitting unit 19, since the structure is not essential to the present invention. FIG. 2 schematically shows the probe unit 15 and the control/imaging unit 20, and FIGS. 3 to 10 show each element of FIG. 2 in more detail.

(Schematic Structure of Probe Unit 15)

As shown in FIG. 2, the probe unit 15 comprises an RF probe 101, an analog processor 102, an analog-to-digital converter (ADC) 103, a pre-transmission processor 104, a transmitting unit 105, a transmitting antenna 106, a receiving antenna 107, a receiving unit 108, a clock signal regenerator 109 and a first type multiplier 110. The transmitting unit 105 and the transmitting antenna 106 provide a first transmitter, while the receiving antenna 107 and the receiving unit 108 provide a first receiver.

(Analog Processor 102 in Probe Unit 15)

Figure 3:
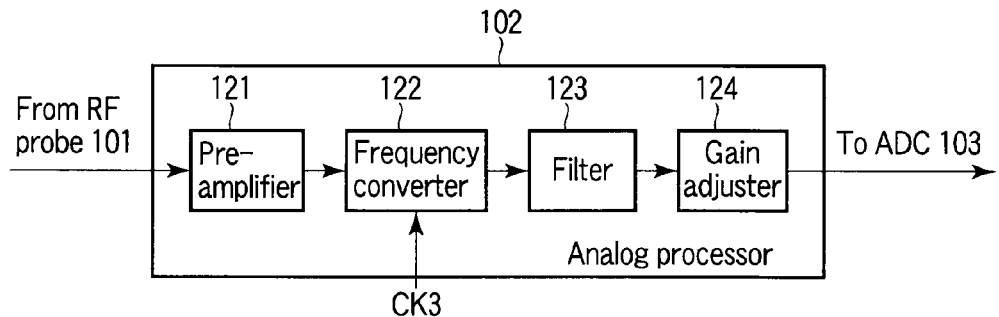
FIG. 3 is a block diagram illustrating an analog processor incorporated in the probe units.

In the probe unit 15, the magnetic resonance signal detected by the RF probe 101 is input to the analog processor 102. The analog processor 102 comprises a preamplifier 121, a frequency converter 122, a filter 123 and a gain adjuster 124 as shown in FIG. 3. The magnetic resonance signal from the RF probe 101 is sent to the preamplifier 121, such as a low noise amplifier (LNA), where it is subjected to voltage amplification. After that, the resultant signal is frequency-converted by the frequency converter 122 based on a conversion clock signal CK3 supplied from the first type multiplier 110, thereby obtaining an intermediate-frequency signal of a preset frequency.

Assuming that the frequency before conversion is fa and the frequency after conversion is fb, the frequency converter 122 performs one or more times frequency conversion in which the input magnetic resonance signal is multiplied by a sine signal with a frequency of fa−fb or fa+fb. In this case, assume that the sine signal is generated based on the conversion clock signal CK3.

The intermediate-frequency signal output from the frequency converter 122 is output from the analog processor 102 via the filter 123 and the gain adjuster 124.

Returning to FIG. 2, the signal output from the analog processor 102, i.e., the magnetic resonance signal obtained after frequency conversion, filtering and gain adjustment, is input to the analog-to-digital converter (ADC) 103, where it is sampled based on a sampling clock signal CK4, to form a digital signal. The resultant magnetic resonance signal output as the digital signal from the ADC 103 is input to the pre-transmission processor 104.

(Pre-Transmission Processor 104 in Probe Unit 15)

Figure 4:
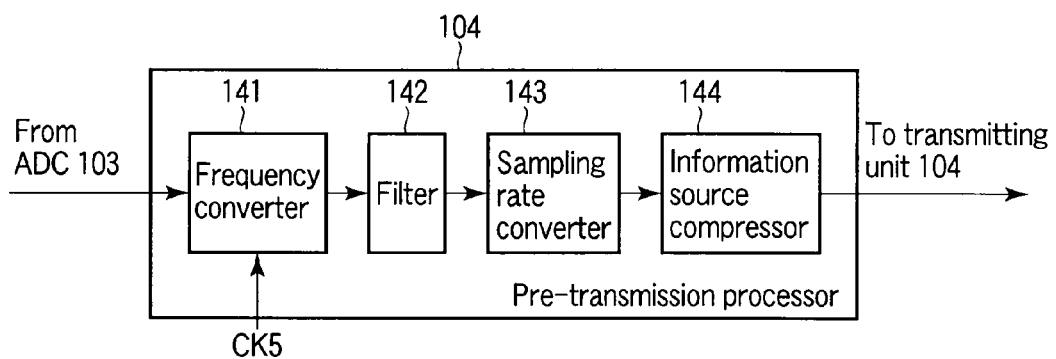
FIG. 4 is a block diagram illustrating a pre-transmission processor incorporated in the probe units.

The pre-transmission processor 104 is used to perform, on the digitized magnetic resonance signal from the ADC 103, digital signal processing necessary before transmission (pre-transmission processing), and comprises a frequency converter 141, a filter 142, a sampling rate converter 143 and an information source compressor 144, as shown in FIG. 4. The digitized magnetic resonance signal from the ADC 103 is frequency-converted by the frequency converter 141 based on a conversion clock signal CK5. The resultant magnetic resonance signal is input to the sampling rate converter 143 via the filter 142, where sampling rate conversion necessary for the ADC 103 to perform oversampling, i.e., decimation, is executed. The sampling rate converter 143 receives a clock signal (not shown) different from the clock signal CK5, and synchronizes with this clock signal. The magnetic resonance signal after sampling rate conversion is reduced in data amount by the information source compressor 144, and is then output as a post pre-processing signal. The post pre-processing signal output from the pre-transmission processor 104 is input to the transmitting unit 105.

(Transmitting Unit 105 in Probe Unit 15)

Figure 5:
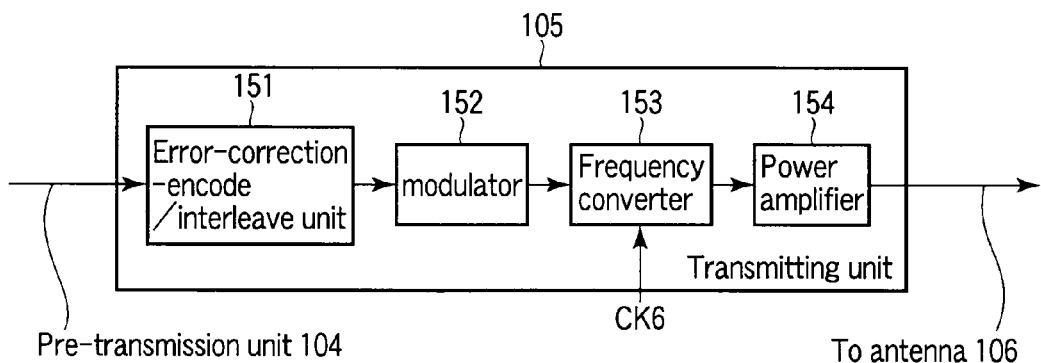
FIG. 5 is a block diagram illustrating a transmitting unit incorporated in the probe units.
Figure 6:
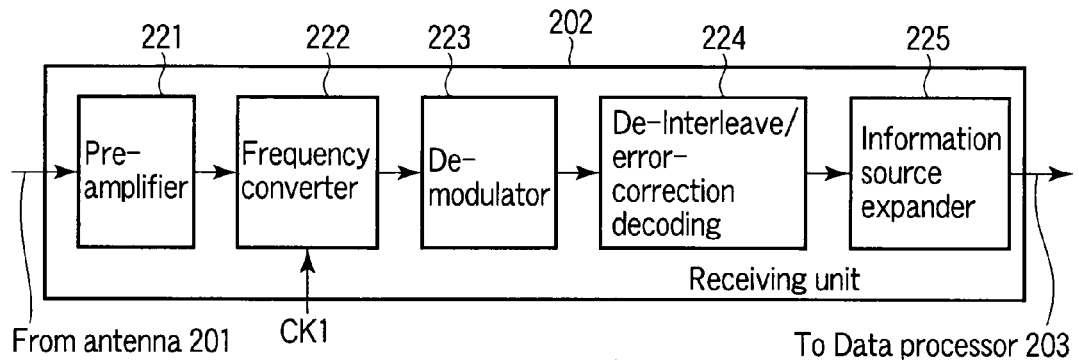
FIG. 6 is a block diagram illustrating a block diagram illustrating a receiving unit incorporated in the control/imaging unit.

As shown in FIG. 5, the transmitting unit 105 comprises an error-correction-encode/interleave unit 151, a modulator 152, a frequency converter 153 and a power amplifier 154. The post pre-processing signal output from the pre-transmission processor 104 is firstly input to the error-correction-encode/interleave unit 151, where it is subjected to an error correction encoding and interleaving process for increasing the error resistance.

Subsequently, the modulator 152 performs, on the data signal resulting from the error correction and interleaving processes, a modulation operation for mapping the data on an IQ plane, and a shaping operation to a single carrier or multicarrier signal. After that, the baseband signal obtained by the modulator 152 is sent to the frequency converter 153, where it is frequency-converted (up-converted) into a signal of a carrier frequency f_rf1 used for a first wireless channel, based on a conversion clock signal CK6 supplied from the first type multiplier 110.

To convert the frequency of the baseband signal into the carrier frequency f_rf1, the frequency converter 153 performs frequency conversion on the baseband signal one or more times. In the frequency conversion, the baseband signal is multiplied by a sine-wave signal generated from the conversion clock signal CK6.

The signal of the carrier frequency f_rf1 output from the frequency converter 153 is amplified to a preset power level by the power amplifier 154, and is sent to the transmitting antenna 106, and then to the control/imaging unit 20 via the first wireless channel.

(Outline of Control/Imaging Unit 20)

As shown in FIG. 2, the control/imaging unit 20 comprises a receiving antenna 201, a receiving unit 202, a data processor 203, a display unit 204, a clock signal generator 205, a first type multiplier 206, a transmitting unit 207 and a transmitting antenna 208. The receiving antenna 201 and the receiving unit 202 form a second receiver, and the transmitting antenna 208 and the transmitting unit 207 form a second transmitter. The receiving unit 202, the first type multiplier 206 and the transmitting unit 207 may be provided independent of the control/imaging unit 20 and located near the gantry.

(Receiving Unit 202 in Control/Imaging Unit 20)

In the control/imaging unit 20, the signal transmitted from the probe unit 12 via the first wireless channel is received by the receiving antenna 201 and input to the receiving unit 202. The receiving unit 202 includes a preamplifier 221, a frequency converter 222, a demodulator 223, a de-interleave/error-correction decoder 224 and an information source expander 225.

The signal received by the antenna 201 is voltage-amplified by the preamplifier 221 formed of, for example, an LNA, and then sent to the frequency converter 222, the demodulator 223, the de-interleave/error-correction decoder 224 and the information source expander 225, where the signal is subjected to processing reverse to that performed in the transmitting unit 105 shown in FIG. 5.

Namely, the received signal output from the preamplifier 221 is down-converted by the frequency converter 222 into the baseband signal based on the conversion clock signal CK1. To convert the carrier frequency f_rf1 of the received signal output from the preamplifier 221, the frequency converter 222 executes frequency conversion on the received signal one or more times. In the frequency conversion, the received signal is multiplied by a sine-wave signal generated from the conversion clock signal CK1.

The baseband signal output from the frequency converter 222 is further subjected to demodulation that is performed by the demodulator 223 and corresponds to the modulation by the modulator 152, then subjected to de-interleave and error correction decoding that correspond to the processes by the error-correction-encode/interleave unit 151, and then subjected to expansion processing that is reverse to the processing of the information source compressor 144. As a result, magnetic resonance signal data is obtained.

The thus-obtained magnetic resonance signal data is input to the data processor 203. The data processor 203 has a structure with, for example, a known data collection unit, storage unit and image reconstruction unit. The data processor 203 is used to collect the magnetic resonance signal data from the receiving unit 202, and store it in the storage unit. The image reconstruction unit performs image reconstruction processing, such as Fourier transform, on the magnetic resonance signal data stored in the storage unit, thereby obtaining the video data (magnetic resonance video data) of a desired nuclear spin in a patient P. The image reconstruction unit may acquire the spectrum data on the desired nuclear spin, or may generate projection data corresponding to the element coils arranged along the respective axes, based on the magnetic resonance signal data associated with the magnetic resonance signal received by the particular element coil designated by a main controller (not shown). The storage unit stores magnetic resonance signal data, video data and spectrum data for each patient.

The above-mentioned series of processes by the data processor 203 are executed in accordance with a processing clock signal CK2 supplied from the first type multiplier 206. The video data or other types of data sent from the data processor 203 are displayed on the display unit 204 when necessary.

(Clock Signal Generator 205)

Figure 7A:
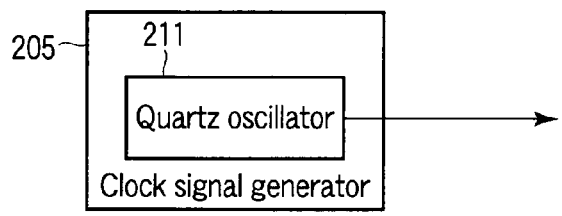
FIG. 7A is a block diagram illustrating an example of a clock signal generator.
Figure 7B:
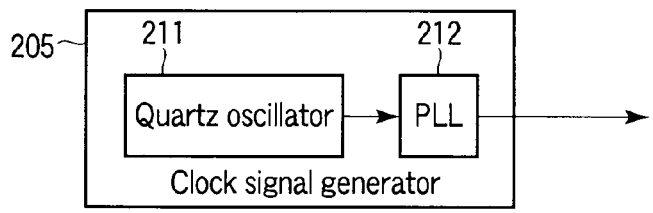
FIG. 7B is a block diagram illustrating another example of the clock signal generator.
Figure 7C:
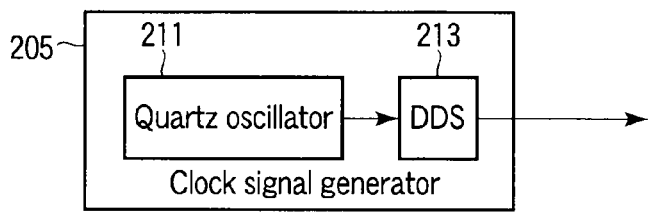
FIG. 7C is a block diagram illustrating yet another example of the clock signal generator.
Figure 7D:
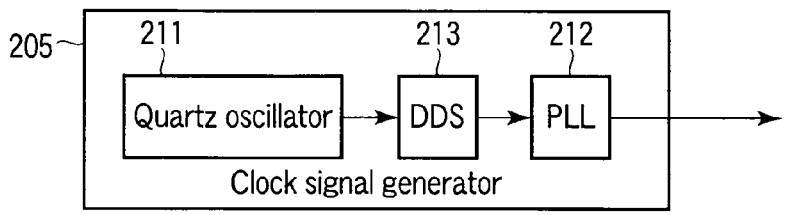
FIG. 7D is a block diagram illustrating a further example of the clock signal generator.

The clock signal generator 205 generates a reference clock signal CK0 that repeatedly varies in amplitude at a preset frequency, and is configured as shown in FIGS. 7A to 7D. The clock signal generator 205 shown in FIG. 7A is realized by a quartz oscillator 211 only. The clock signal generator 205 shown in FIG. 7B comprises the quartz oscillator 211 and a phase-locked loop (PLL) 212. The clock signal generator 205 shown in FIG. 7C comprises the quartz oscillator 211 and a direct digital synthesizer (DDS) 213 driven by the quartz oscillator 211. The clock signal generator 205 shown in FIG. 7D comprises the quartz oscillator 211, the DDS 213 driven by the quartz oscillator 211, and the PLL 212 provided after the DDS 213.

The PLL 212 has a general structure that comprises a phase comparator 2121, a loop filter 2122 and a voltage control oscillator (VCO) 2123. When necessary, a divider 2124 is added to this structure. The phase comparator 2121 compares the phase of an input reference signal with that of a signal fed back from the VCO 2123 directly or via the divider 2124, and outputs a signal corresponding to the phase difference therebetween. The signal output from the phase comparator 2121 is filtered by the loop filter (generally, a low-pass filter) 2122 into a frequency control voltage. The frequency control voltage is input to the frequency control terminal of the VCO 2123. As a result, the VCO 2123 outputs a signal in synchronism with the reference signal input to the phase comparator 2121.

(First Type Multiplier 206)

The reference clock signal CK0 output from the clock signal generator 205 is supplied to the first type multiplier 206 and the transmitting unit 207. The first type multiplier 206 uses the reference clock signal CK0 as a reference frequency signal, and multiplies the reference frequency signal by a preset multiplication ratio, thereby generating the conversion clock signal CK1 for the receiving unit 202, and the processing clock signal CK2 for the data processor 203.

The transmitting unit 207 includes an AM modulator for AM-modulating the carrier wave signal using the reference clock signal CK0 from the clock signal generator 205, converts the reference clock signal CK0 into a radio signal, and supplies the radio signal to the transmitting antenna 208. The AM modulator may perform amplitude modulation for providing non-discrete amplitudes, represented by analog AM modulation, or for providing discrete amplitudes, represented by, for example, On-Off Keying (OOK).

(Transmitting Unit 207 in Control/Imaging Unit 20)

FIG. 9 shows a specific example of the transmitting unit 207 in the control/imaging unit 20. As shown, the transmitting unit 207 comprises a second type multiplier 271, a carrier wave generator 272 and a power amplifier 273. The reference clock signal CK0 from the clock signal generator 205 is sent to the second type multiplier 271, where it is subjected to AM modulation in which the signal is multiplied by a carrier wave signal of a frequency f_rf2 sent from the carrier wave generator 272. As a result, the radio signal as an AM wave sent from the second type multiplier 271 is amplified to a preset power level by the power amplifier 273, and is then sent to the probe unit 15 from the transmitting antenna 208 via a second wireless channel.

The radio signal sent from the control/imaging unit 20 via the second wireless channel and AM-modulated using the reference clock signal is received by the receiving antenna 107 of the probe unit 15, and is input to the receiving unit 108. The receiving unit 108, in turn, performs envelope detection on the AM-modulated radio signal from the receiving antenna 107, and outputs a received signal resulting from the envelope detection.

(Receiving Unit 108 of Probe Unit 15)

FIG. 10 shows a specific example of the receiving unit 108. As shown, the receiving unit 108 comprises a preamplifier 181, a rectifier 182 and a filter 183. The AM-modulated radio signal from the receiving antenna 107 is voltage-amplified by the preamplifier 181, such as an LNA, then rectified by the rectifier 182, and filtered through the filter 183, whereby it is subjected to envelope detection. A received signal resulting from the envelope detection is input to the clock signal regenerator 109.

(Clock Signal Regenerator 109)

Upon receiving the received signal from the receiving unit 108, the clock signal regenerator 109 regenerates a clock signal and outputs a regenerated clock signal. The clock signal regenerator 109 may extract or regenerate the clock signal using the PLL described referring to FIG. 8, or using a bandpass filter (BPF) having an accurate frequency selection property for clock signals. If the PLL is used as the clock signal regenerator 109, the clock signal can be regenerated with higher accuracy than the clock signal extraction using the BPF. In this case, however, the PLL includes a feedback loop, and hence a long time is required to obtain a stable signal. In view of the response speed, the BPF is preferable.

(First Type Multiplier 110)

The regenerated clock signal from the clock signal regenerator 109 is input to the first type multiplier 110. The first type multiplier 110 uses, as a reference frequency, the frequency of the regenerated clock signal from the clock signal regenerator 109, and multiplies the reference frequency by a preset multiplication ratio to thereby generate clock signals necessary for the elements of the probe unit 15, i.e., the conversion clock signal CK3 to be sent to the analog processor 102, the sampling clock signal CK4 to be sent to the ADC 103, the conversion clock signal CK5 to be sent to the pre-transmission processor 104, and the conversion clock signal CK6 to be sent to the transmitting unit 105.

(Clock Signal Synchronization Between Probe Unit 15 and Control/Imaging Unit 20)

The above-described structure of the first embodiment enables the probe unit to be made simple in structure, and enables the clock signals for the probe unit 15 and the control/imaging unit 20 to be synchronized highly accurately.

Even if respective highly accurate oscillators are provided for the probe unit 15 and the control/imaging unit 20, the frequency of the reference clock signal for data processing cannot be made completely identical to that of the clock signal for the probe unit side. However, if the reference clock signal is transmitted by radio from the control/imaging unit 20 to the probe unit 15 using a certain method, the clock signals between the control/imaging unit 20 and the probe unit 15 can be made equal in frequency to each other and therefore be synchronized with each other, using the clock signal regenerator 109 formed of, for example, a PLL.

In the first embodiment, since the AM modulation scheme is employed for transmission of the reference clock signal, the receiving unit 108 of the probe unit 15 can obtain a received signal without a highly accurate oscillator, utilizing envelope detection wave for detecting the envelope of the received radio signal, and the clock regeneration unit 109 can regenerate the clock signal based on the thus-obtained received signal.

Since thus, no accurate oscillator is needed in the probe unit 15, the probe unit 15 can be made compact and light, and the load on the patient P can be reduced. Further, this structure is free from the problem that the accuracy of the regenerated clock signal depends upon the accuracy of the oscillator and the accuracy of the clock signal used for the ADC.

When the high-frequency coil unit 13 applies an electromagnetic pulse signal to the patient P, and the probe units 14 and 15 receive a magnetic resonance signal emitted as an electromagnetic echo from the patient P as in the MRI apparatus of the first embodiment, it is desirable that the bands of the first and second wireless channels with central frequencies of f_rf1 and f_rf2 employed between the probe unit 15 and the control/imaging unit 20 should avoid the frequencies identical to the frequency of the electromagnetic pulse signal and the harmonics thereof. By thus setting the bands of the first and second wireless channels, the magnetic pulse signal and the magnetic resonance signal are prevented from interfering with the first and second wireless channels.

On the other hand, when the probe unit 15 regenerates a clock signal as a periodical signal, and the first type multiplier 110 generates various clock signals, it is desirable that the fundamental wave and harmonics of each clock signal should not be equal to the frequencies of the magnetic pulse signal and magnetic resonance signal. This prevents degradation of the quality of magnetic resonance video data that will occur if electromagnetic interference (EMI) by the probe unit 15 disturbs the magnetic pulse signal and magnetic resonance signal.

(Case where Clock Signal Regeneration Stop Zone Exists)

A description will be given of the selection of the frequency of the reference clock signal CK0 to be sent from the control/imaging unit 20 to the probe unit 15 when the clock signal regenerator 109 of the probe unit 15 cannot output a reliable clock signal for some reason, or when a zone (hereinafter referred to as "the clock signal regeneration stop zone"), in which the output of the clock signal is stopped, exists.

The clock signal regeneration stop zone will occur (a) when the quality of the clock signal received by the probe unit 15 via the second wireless channel is degraded due to transmission loss of radio signals or electromagnetic interference, or (b) when the entire apparatus is malfunctioned due to irradiation of strong electromagnetic wave, or (c) when the clock signal regenerator 109 is intentionally and temporarily stopped to avoid the above-mentioned circumstances. For instance, where the probe unit 15 is placed in the gantry of the MRI apparatus, the zone, in which an RF pulse signal as strong electromagnetic wave is applied, may correspond to the clock signal regeneration stop zone.

Referring then to FIG. 11, a problem that will occur when the clock signal regeneration stop zone exists during the observation of a magnetic resonance signal will be described. Assume here that the magnetic resonance signal to be collected by the data processor 208 of the control/imaging unit 20 is a signal sampled using a reference clock signal CK0 of a frequency f1. As aforementioned, it is not uncommon that the ADC 103 of the probe unit 15 performs sampling (oversampling) with a frequency higher than f1, and the pre-transmission processor 104 following the ADC 103 performs sampling rate conversion (decimation).

Assume also that a clock signal (hereinafter, transmission clock signal) of a frequency f2 (>f1) is transmitted from the control/imaging unit 20 to the probe unit 15 and used as a sampling clock signal for the ADC 103, and a divided clock signal of the frequency f1 generated by dividing the transmission clock signal is used as a clock signal for the sampling rate converter 143. When f2/f1=N, if the transmission clock signal is divided using a division ratio of N, N clock signals having different phases and the same frequency f1 are generated.

FIG. 11 shows an example case where if N=2, when divisional clock signals synchronizing with the leading edge of a transmission clock signal of f2 are obtained, divisional clock signals 1 and 2 having the same frequency f1 and different phases will actually be obtained. Because of this uncertainty in phase, the divisional clock signals may be asynchronous with the transmission clock signal (reference clock signal) before and after the clock signal regeneration stop zone. Therefore, if the clock signal regeneration stop zone exists during the observation of a magnetic resonance signal, phase shifting may occur in the obtained magnetic resonance signal sequence, thereby degrading the quality of the magnetic resonance video data.

Although it is described in the above embodiment that oversampling is performed in the ADC 103 and decimation is performed in the pre-transmission processor 104, the same problem as mentioned above will occur even when frequency conversion or filtering is performed between oversampling and decimation.

On the other hand, when the probe unit 15 side requires a plurality of clock signals having different frequencies but being in phase with each other, it is inefficient if the control/imaging unit 20 side outputs the clock signals. In light of this, in the first embodiment, the above-mentioned problem is eliminated by transmitting clock signals being in phase with the reference clock signal CK0 and having frequencies lower than the frequency of the reference clock signal CK0.

Figure 12:
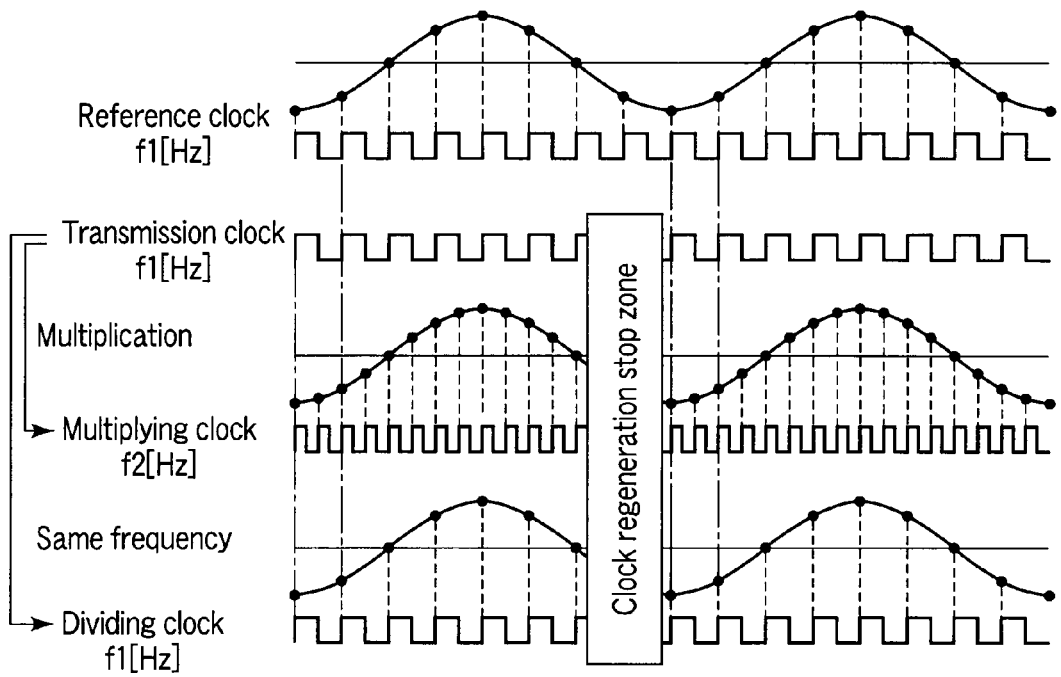
FIG. 12 is a timing chart useful in explaining a mechanism for solving the phase shift problem that occurs when the clock signal regeneration stop period exists.

FIG. 12 shows a case where the frequency of the transmission clock signal is equal to that of the reference clock signal CK0. The control/imaging unit 20 transmits the reference clock signal CK0 of the frequency f1 as the transmission clock signal.

The probe unit 15 regenerates the transmission clock signal (reference clock signal CK0) from the received signal, and generates the conversion clock signal CK3, the sampling clock signal CK4 of the frequency f2, and the conversion clock signal CK5 by multiplying the regenerated clock signal by preset values. After the ADC 103 performs sampling using the sampling clock signal CK4, if the frequency converter 141 performs frequency conversion using the conversion clock signal CK3 of the same frequency f1 as the reference clock signal CK0, and the sampling rate converter 143 performs decimation, no phase shifting will occur before and after the clock regeneration stop zone.

Figure 13:
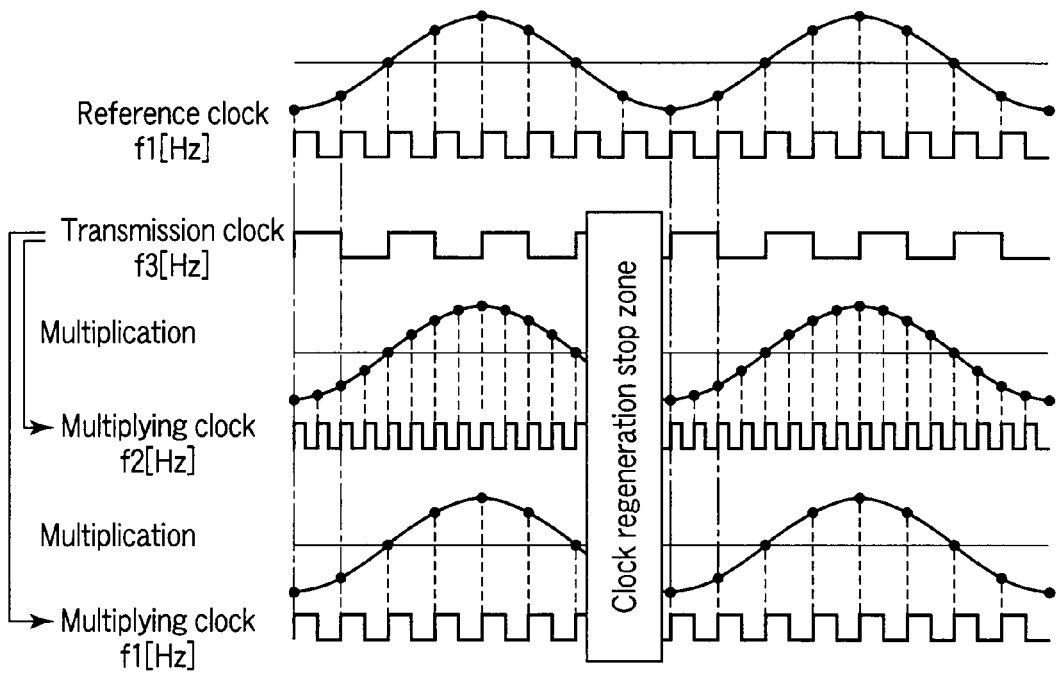
FIG. 13 is a timing chart useful in explaining another mechanism for solving the phase shift problem that occurs when the clock signal regeneration stop period exists.

FIG. 13 shows a case where the frequency of the transmission clock signal is not higher than the frequency of the reference clock signal CK0. The control/imaging unit 20 supplies the probe unit 15 with a clock signal of a frequency f3 as the transmission clock signal, which results from the division of the reference clock signal CK0 of the frequency f1.

The probe unit 15 regenerates the transmission clock signal (reference clock signal CK0) from the received signal, and generates the conversion clock signal CK3, the sampling clock signal CK4 of the frequency f2, and the conversion clock signal CK5 by multiplying the regenerated clock signal by preset values. After the ADC 103 performs sampling using the sampling clock signal CK4, if the frequency converter 141 performs frequency conversion using the conversion clock signal CK3 of the frequency f1, and the sampling rate converter 143 performs decimation, no phase shifting will occur before and after the clock regeneration stop zone.

As aforementioned, if the clock signal regenerator 109 uses such a PLL as shown in FIG. 8, it can regenerate a clock signal with higher accuracy than the case of clock extraction/regeneration using a BPF, but requires a longer time to obtain a reliable signal because of its feedback loop. Where the RF pulse irradiation zone corresponds to the clock regeneration stop zone, and acquisition of a magnetic resonance signal is started after the zone as in the MRI apparatus, it is advantageous to design the loop filter 2122 in FIG. 8 to enable the PLL to complete phase lock until the magnetic resonance signal is acquired after the clock regeneration stop zone. However, if the time ranging from the clock regeneration stop zone to the signal acquisition is short, and hence the loop filter cannot be designed to complete phase lock within the time, the extraction/regeneration of the clock signal using the BPF is advantageous.

Second Embodiment

Figure 14:
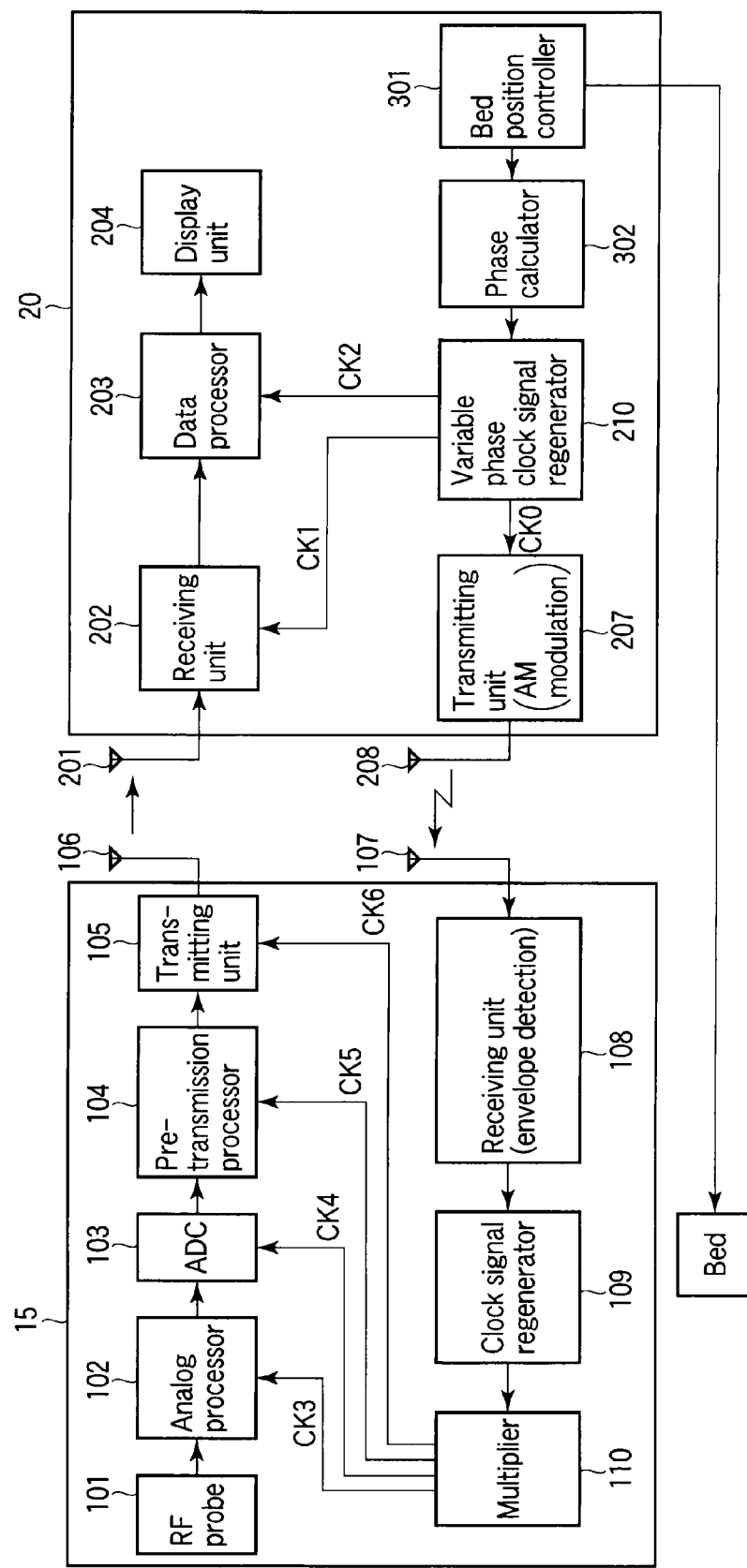
FIG. 14 is a block diagram illustrating other examples of one of the probe units and the control/imaging unit shown in FIG. 1.

A description will now be given of a second embodiment. The MRI apparatus of the second embodiment has substantially the same configuration as the first embodiment shown in FIG. 1. FIG. 14 shows a wireless probe unit 15 and control/imaging unit 20 employed in the second embodiment.

In FIG. 14, elements similar to those of the first embodiment are denoted by corresponding reference numbers, and only different elements will be described. In the second embodiment, the clock signal generator 205 and the first type multiplier 206 are replaced with a variable phase clock generator 210, and a bed position controller 301 and a phase calculator 302 are provided in the probe unit 15. The second embodiment can prevent phase shifting during acquisition of a magnetic resonance signal, using a clock signal phase compensation function that will be described later.

The receiving antenna 107 of the probe unit 15 is located on a bed 16 controlled by the bed position controller 301. The transmitting antenna 208 of the control/imaging unit 20 is provided in a preset fixed position. Accordingly, the distance between the receiving antenna 107 and the transmitting antenna 208, i.e., the transmission range of the second wireless channel, varies.

The receiving unit 202 and the data processor 203 of the control/imaging unit 20 receive the conversion clock signal CK1 and the processing clock signal CK2 from the variable phase clock generator 210, respectively.

The bed position controller 301 controls the position of the bed 16, and outputs information indicating the coordinates (x, y, z) of the position of the bed 16. In MRI apparatuses, it is sufficient if a first dimensional coordinate (x) is determined. However, to impart universality, the following description will be given using three-dimensional coordinates.

Assume that the transmitting antenna 208 is fixed at a position indicated by coordinates of (xa, ya, za). The phase calculator 302 continuously receives, from the bed position controller 301, information indicating the position coordinates (x, y, z) of the bed 16, and calculates the transmission range of the second wireless channel based on the bed position coordinates (x0, y0, z0) assumed when acquisition of the magnetic resonance signal is started, and the current bed position coordinates (x1, y1, z1), using the following equation (1):

$$\Delta d = \sqrt{(x1-xa)^2 + (y1-ya)^2 + (z1-za)^2} - \sqrt{(x0-xa)^2 + (y0-ya)^2 + (z0-za)^2} \quad (1)$$

Subsequently, the phase shift of a clock signal having the frequency f1, which corresponds to a change $\Delta d$ in the transmission range calculated by the above equation (1), is calculated using the following equation (2):

$$\Delta \phi = \frac{2\pi f 1 \Delta d}{c} \quad (2)$$

where c is the velocity of light (i.e., $c=3.0\times10^8$ [m/s]), and $\Delta\phi$ indicates, when it has a plus value, that the phase of the clock signal is delayed from that of the reference clock signal, and indicates, when it has a negative value, that the phase of the clock signal is advanced from that of the reference clock signal.

The equation (2) indicates that if the transmission range of the second wireless channel becomes wide ($\Delta d>0$), the phase of the clock signal will be delayed, whereas if the transmission range of the second wireless channel becomes narrow ($\Delta d<0$), the phase of the clock signal will advance. Although in the embodiment, the bed position controller 301 outputs coordinate information indicating the absolute position of the bed 16, it may output the relative position of the bed 16 (=the coordinates (x1, y1, z1) of the current position−the coordinates (x0, y0, z0) of the position assumed when magnetic resonance signal acquisition is started) with respect to the position assumed when magnetic resonance signal acquisition is started.

For instance, the variable phase clock generator 210 has substantially the same structure as the clock generator 205 shown in FIG. 2, i.e., it is formed of the quartz oscillator 211 only, or the quartz oscillator 211 and the PLL 212 provided after the oscillator 211, or the quartz oscillator 211 and the DDS 213 driven by the oscillator, or the quartz oscillator 211, the DDS 213 driven by the oscillator and the PLL 212 provided after the DDS 213, as is shown in FIGS. 7A to 7D. The variable phase clock generator 210 supplies the data processor 203 with the processing clock signal CK2 of the frequency f1.

The variable phase clock generator 210 also has a function of adjusting the phase of the processing clock signal CK2 based on the phase obtained by multiplying the phase shift $\Delta\phi$ by −1, using the DDS 213 or the PLL 212 provided after the DDS 213, and outputs a phase-adjusted clock signal CK0. Namely, the clock signal CK0 is a clock signal that has the same frequency as the clock signal CK2 and is obtained by beforehand compensating for a phase change due to movement of the bed 16. Accordingly, even if the bed 16 is moved during the acquisition of the magnetic resonance signal to thereby change the transmission range of the second wireless channel, the clock signals CK3 to CK6 that each have a preset phase relationship with respect to the conversion clock signal CK1 and the processing clock signal CK2 used in the control/imaging unit 20 can always be obtained in the probe unit 15. This means that degradation of the quality of magnetic resonance video data due to phase shifting in the clock signals during the acquisition of the magnetic resonance signal can be avoided.

Further, to prevent phase shifting in the clock signals during the acquisition of the magnetic resonance signal, the bed 16 and the receiving antenna 107 of the probe unit 15 may not be interlocked each other, i.e., the receiving antenna 107 may be fixed in position, in order to fix the relative positional relationship between the receiving antenna 107 and the transmitting antenna 208 of the control/imaging unit 20.

As described above, the second embodiment provides, in addition to the advantage of the first embodiment, the advantage of preventing phase shifting in the clock signals used in the probe unit 15 by transmitting, from the control/imaging unit 20 to the probe unit 15, a clock signal having a phase shift beforehand compensated for, the phase shift being caused by the displacement of the bed 16 during the acquisition of the magnetic resonance signal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising a probe unit and a control/imaging unit, the probe unit including:
   a probe which detects a magnetic resonance signal in a subject;
   an analog-to-digital converter which samples the magnetic resonance signal using a sampling clock signal, and converts the sampled magnetic resonance signal into a digital signal;
   a first transmitter which converts the digital signal into a first radio signal and transmits the first radio signal through a first wireless channel;
   a first receiver which receives a second radio signal transmitted through a second wireless channel, and performs detection on the second radio signal in order to obtain a first received signal; and
   a clock regeneration unit configured to regenerate a clock component from the first received signal in order to generate a regenerated clock signal that is used as a base signal for the sampling clock signal, the control/imaging unit including:
   a second receiver which receives the first radio signal in order to obtain a second received signal;
   a clock generator which generates a reference clock signal;
   a data processor which performs data processing on the second received signal in synchronism with the reference clock signal in order to obtain a video signal, the data processing including image reconstruction processing; and
   a second transmitter including a modulator which modulates a carrier wave using the reference clock signal, the second transmitter converting the reference clock signal into the second radio signal and transmitting the second radio signal through the second wireless channel to the first receiver in order to obtain the first received signal from which said clock component is regenerated by said clock regeneration unit.

2. The apparatus according to claim 1, wherein the first receiver receives the first radio signal using a receiving antenna provided on a bed which is movable with the subject mounted thereon;
   the second transmitter transmits the second radio signal using a transmitting antenna fixed in position; and
   the clock generator compensates for a phase of the reference clock signal when a distance between the receiving antenna and the transmitting antenna varies.

3. The apparatus according to claim 1, wherein the first receiver receives the first radio signal using a receiving antenna provided on a bed which is movable with the subject mounted thereon;
   the second transmitter transmits the second radio signal using a transmitting antenna fixed in position;
   the control/imaging unit further includes a position control unit configured to control a position of the bed and output coordinate information indicating the position of the bed, and a phase calculation unit configured to calculate a change in a distance between the receiving antenna and the transmitting antenna using the coordinate information, and calculate a phase shift corresponding to the change; and
   the clock generator adjusts a phase of the reference clock signal by the phase shift in order to compensate for the phase of the reference clock signal when the distance between the receiving antenna and the transmitting antenna varies.

4. The apparatus according to claim 1, wherein the first receiver receives the first radio signal using a receiving antenna fixed in position; and the second transmitter transmits the second radio signal using a transmitting antenna fixed in position.

5. A magnetic resonance imaging apparatus comprising:
a probe unit and a control/imaging unit, the probe unit including:
   a probe which detects a magnetic resonance signal in a subject;
   an analog-to-digital converter which samples the magnetic resonance signal using a sampling clock signal, and converts the sampled magnetic resonance signal into a first digital signal;
   a pre-transmission processor which performs pre-transmission processing on the first digital signal in synchronism with a first processing clock signal in order to obtain a second digital signal;
   a first transmitter which converts the second digital signal into a first radio signal and transmits the first radio signal through a first wireless channel;
   a first receiver which receives a second radio signal transmitted through a second wireless channel, and performs detection on the second radio signal in order to obtain a first received signal;
   a clock regeneration unit configured to regenerate a clock component from the first received signal in order to generate a regenerated clock signal; and
   a first multiplier which multiplies the regenerated clock signal by preset values in order to generate the sampling clock signal and the first processing clock signal, the control/imaging unit including:
      a second receiver which receives the first radio signal in order to obtain a second received signal;
      a clock generator which generates a reference clock;
      a second multiplier which multiplies the reference clock signal by a first preset value in order to generate a second processing clock signal;
      a data processor which performs data processing on the second received signal using the second processing clock signal in order to obtain a magnetic resonance imaging signal, the data processing including image reconstruction processing; and
      a second transmitter including a modulator which modulates a carrier wave using the reference clock signal, the second transmitter converting the reference clock signal into the second radio signal and transmitting the second radio signal through the second wireless channel to the first receiver in order to obtain the first received signal from which said clock component is regenerated by said clock regeneration unit.

6. The apparatus according to claim 5, wherein the first multiplier also multiplies the regenerated clock signal by a second preset value in order to generate a first conversion clock signal; and the probe unit further includes an analog processor including a first frequency converter interposed between the probe and the analog-to-digital converter, the first frequency converter converting a frequency of the magnetic resonance signal using the first conversion clock signal.

7. The apparatus according to claim 5, wherein the first multiplier also multiplies the regenerated clock signal by a third preset value in order to generate a second conversion clock signal; and
the first transmitter includes a second frequency converter which converts a frequency of the second digital signal using the second conversion clock signal, in order to generate the first radio signal.

8. The apparatus according to claim 5, wherein the second multiplier also multiplies the reference clock signal by a fourth preset value in order to generate a third conversion clock signal; and
the second receiver includes a third frequency converter which converts a frequency of the first digital signal using the third conversion clock signal, in order to generate the second received signal.

9. The apparatus according to claim 5, wherein the second multiplier also multiplies the reference clock signal by a fifth preset value in order to generate a fourth conversion clock signal; and
the second transmitter includes a second frequency converter which converts a frequency of the reference clock signal using the fourth conversion clock signal, in order to generate the first radio signal.

10. The apparatus according to claim 5,
wherein the reference clock signal has a frequency equal to or less than a minimum frequency of the first processing clock signal, and is in phase with the first processing clock signal.

11. The apparatus according to claim 5,
wherein the first receiver receives the first radio signal using a receiving antenna provided on a bed which is movable with the subject mounted thereon;
the second transmitter transmits the second radio signal using a transmitting antenna fixed in position; and
the clock generator compensates for a phase of the reference clock signal when a distance between the receiving antenna and the transmitting antenna varies.

12. The apparatus according to claim 5,
wherein the first receiver receives the first radio signal using a receiving antenna provided on a bed which is movable with the subject mounted thereon;
the second transmitter transmits the second radio signal using a transmitting antenna fixed in position;
the control/imaging unit further includes:
   a position control unit configured to control a position of the bed and output coordinate information indicating the position of the bed, and
   a phase calculation unit configured to calculate a change in a distance between the receiving antenna and the transmitting antenna using the coordinate information, and calculate a phase shift corresponding to the change; and
the clock generator adjusts a phase of the reference clock signal by the phase shift in order to compensate for the phase of the reference clock signal when the distance between the receiving antenna and the transmitting antenna varies.

13. The apparatus according to claim 5,
wherein the first receiver receives the first radio signal using a receiving antenna fixed in position; and
the second transmitter transmits the second radio signal using a transmitting antenna fixed in position.

* * * * *